United States Patent [19]

Wiley

[11] Patent Number: 4,907,671

[45] Date of Patent: Mar. 13, 1990

[54] WIDE DISPERSION REFLECTOR

[75] Inventor: Robert J. Wiley, Wichita, Kans.

[73] Assignee: Unique Musical Products, Inc., Effingham, Ill.

[21] Appl. No.: 179,491

[22] Filed: Apr. 8, 1988

[51] Int. Cl.[4] .................... H05K 5/00

[52] U.S. Cl. .................... 181/156; 181/175; 181/199; 381/160

[58] Field of Search .................... 181/141, 144, 150, 153, 181/148, 155, 199, 175; 381/156, 160

[56] References Cited

U.S. PATENT DOCUMENTS

| | | | |
|---|---|---|---|
| 1,786,279 | 12/1930 | Wolff | 181/155 |
| 2,643,727 | 6/1953 | Leon | 181/155 |
| 3,816,672 | 6/1974 | Gefvert et al. | 181/144 X |
| 4,085,289 | 4/1978 | Schmideler | 181/153 X |
| 4,227,050 | 10/1980 | Wilson | 181/155 X |

FOREIGN PATENT DOCUMENTS

| | | | |
|---|---|---|---|
| 143597 | 9/1951 | United Kingdom | 181/155 |

*Primary Examiner*—B. R. Fuller

*Attorney, Agent, or Firm*—Wood, Herron & Evans

[57] ABSTRACT

A reflector disperses the audio waves from a loudspeaker acoustic source in a substantially 180 degree pattern. The reflector, coupled with a speaker, forms a loudspeaker system producing a wide dispersion of audio waves in a listening area. The reflector can be adjusted to alter the direction of the dispersal pattern in the listening area.

28 Claims, 2 Drawing Sheets

WIDE DISPERSION REFLECTOR

FIELD OF THE INVENTION

This invention relates to loudspeaker reflectors having wide angle dispersion characteristics.

BACKGROUND OF THE INVENTION

From the beginning of man's enjoyment of recorded music, efforts have been continually made to improve the quality of reproduction of the recorded sounds. Improvements have been made in the means for producing recorded sounds, for amplifying the recorded signal, and for playing back the recorded signals into a listening area. The loudspeakers used for music playback serve as but one example of the continuing effort to produce improved, high fidelity sound.

Loudspeaker designs have been developed over the years to address a variety of shortcomings in the reproduction process. One problem in obtaining faithful reproduction of an audio input signal is attributable to the varying energies of the output audio waves from the loudspeaker. Low frequency waves propagated from an acoustic source such as a loudspeaker are quickly dispersed in the listening area as the wave moves from the acoustic source. Such waves are described as non-directional. Higher frequency waves of from about 250 Hz to the upper range of human audibility do not disperse as readily as they leave the acoustic source. The waves, which are propagated in a specific direction, tend to maintain that direction for a longer period of time than the low frequency waves. Thus, the higher frequency waves are described as directional, the effect being known generally as the beaming effect.

A person standing directly in front of a loudspeaker acoustic source generating a wide band of frequency waves will be able to perceive the full frequency output. That same person, standing off to one side of the loudspeaker acoustic source, would perceive more of the low frequency waves than of the high frequency waves because of the dispersal properties of the low frequency waves. A person standing directly in front of a loudspeaker acoustic source is said to listen to the audio output "on axis". A person standing to the side of the loudspeaker acoustic source perceives the audio signal "off axis".

One is able to enjoy the maximum frequency response of the loudspeaker acoustic source by positioning oneself close to the "on axis" line of the loudspeaker. Unfortunately, movement away from the axis decreases one's enjoyment of full frequency response output.

SUMMARY OF THE INVENTION

The invention addresses the problem of off-axis loss of frequency response of higher frequency audio waves with the use of a wide dispersion reflector placed near to a loudspeaker acoustic source. The reflector channels the directional output from the loudspeaker acoustic source into a substantially 180 degree dispersal pattern, producing an output of all high frequency audio waves contained in the program material over the entire 180 degree listening area. The reflecting surface of the wide dispersion reflector is also designed to produce minimum phase cancellation of the audio output from the loudspeaker acoustic source. Phase cancellation occurs when sounds of the same frequency arrive at the ear from different points at the same time. Sound being the propagation of successive waves of compressed and rarified air, total phase cancellation occurs when the trough of one wave reaches the ear at the same time the peak of a wave of the same frequency arrives at the ear. Partial phase cancellation may also occur by the arrival of waves slightly out of phase with each other.

A further feature of the invention provides for the programmability of the reflector to adjust the audio dispersal pattern in relation to the dimensions of the listening room. This feature permits one to position a loudspeaker containing the reflector invention on or near a wall and still minimize the reflection of audio waves from that wall. Adjustment of the reflector is carried out by adjusting means, such as a series of set screws connected to the reflector and positioned to the rear of the speaker enclosure.

It is thus an object of the invention to provide an audio wave reflector having a substantially 180 degree dispersal pattern. It is also an object to provide a loudspeaker in combination with an audio wave reflector having a substantially 180 degree dispersal pattern. It is a further object to provide a reflector having a construction which minimizes phase cancellation of the audio signal. It is yet a further object of the invention to provide for the adjustment of the direction of the dispersal pattern to accommodate the specific dimensions of the listening room and the individual preferences of the listener.

These and other objects and advantages will become readily apparent from the following detailed description of the invention and from the drawings in which:

DETAILED DESCRIPTION OF THE INVENTION

Figure 1:
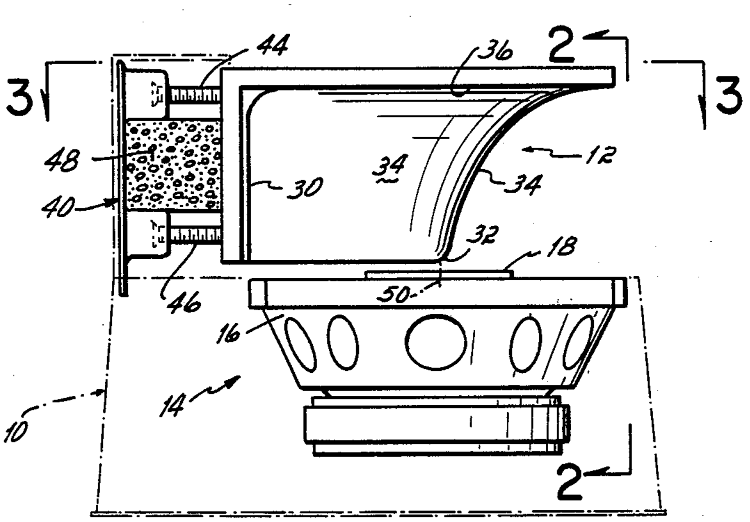
FIG. 1 is a side elevational view of the reflector with a loudspeaker acoustic source positioned below.

The invention in its broader aspects relates to a reflector for distributing audio waves in a substantially 180 degree dispersal pattern from a diaphragm speaker propagating the audio waves along a substantially single axis. The reflector comprises a flat back wall substantially parallel to and laterally spaced from the axis of the speaker, a reflecting surface connected to the back wall, the reflecting surface having a leading edge connected to the back wall near the speaker, the leading edge approximately intersecting the axis, and a trailing edge connected to the back wall and the reflecting surface, the trailing edge encompassing an area greater than the area of the speaker. The diaphragm speaker is the preferred source of audio waves, but other acoustic sources may be employed. The preferred diaphragm speaker is the cone speaker, which utilizes a paper-like conically shaped moving surface to generate audio waves.

The leading edge of the reflector is preferably in a position approximately perpendicular to the back wall. In a more preferred aspect, the reflecting surface extends from the leading edge of the reflector at an angle of approximately 45°. It is contemplated that the reflecting surface be concave, and more preferably that the surface have the shape of a parabola to improve the vertical dispersability of the audio waves to the listener.

The reflector is coupled to a diaphragm speaker which propagates audio waves in a generally vertical direction. The reflector alters the direction of the audio waves substantially from the vertical to the horizontal to produce maximum effect in a defined listening area.

Preferably, to maximize transfer of the audio waves into the listening area, the back wall of the reflector is positioned to lie outside the path of the audio waves. It is preferred that the leading edge, reflecting surface and trailing edge of the reflector are integrally formed from a single material, or, in other words, that there be no seams or joints between these elements of the reflector to interfere with the dispersal characteristics. It is envisioned that the reflector be integrally formed from molded plastic, which permits creation of a highly reflective surface having the desired reflection angle properties. However, other materials, such as wood or metal may be employed to like effect. The acoustic source to be reflected may be one diaphragm speaker, but the invention also encompasses use of more than one speaker. Where more than one speaker is employed to form a single acoustic source, i.e. a mid-range speaker with a coaxially mounted tweeter, the speakers are arranged in a centered, overlying relation such that the smaller diameter speaker lies in closer relation to the leading edge of the reflector.

The invention encompasses in addition the combination of diaphragm speaker with reflector, with means to acoustically couple the speaker to the reflector, to produce a loudspeaker system for distributing audio waves into a listening area in a substantially 180 degree dispersal pattern. The coupling is accomplished by combining the speaker and reflector in an enclosure, or multiple enclosures set in specific relation to each other. The enclosures are produced from structural plastic, wood, or other appropriate rigid material. The various preferred aspects of the reflector, described above and below, are to be incorporated into the diaphragm speaker reflector combination envisioned in this invention.

It is a further feature of this invention to provide for the adjustment of the reflector in relation to the diaphragm speaker to adjust the direction of the dispersal pattern. The programmable reflector comprises a flat back wall substantially parallel to and laterally spaced from the axis, a reflecting surface connected to the back wall, the reflecting surface having a leading edge connected to the back wall near the speaker, the leading edge approximately intersecting the axis, a trailing edge connected to the back wall and the reflecting surface, the trailing edge encompassing an area greater than the area of the speaker, a support plate positioned parallel to the back wall and opposite the reflecting surface, a tensioning device disposed between the plate and the back wall, and adjusters connecting the back wall of the reflector and the support plate for rendering the back wall non-parallel to the support plate. It is preferred that the leading edge be approximately perpendicular to the back wall. It is further preferred that the adjusters be a plurality of screws which permit fine gradations of adjustment of the reflector to optimize the dispersal pattern in the particular room environment. However, it is contemplated that a variety of adjustment systems, known to those skilled in the art, may be employed. It is further contemplated that the tensioning device separating the support plate from the back wall of the reflector be of a type which maintains its structural integrity over a period of time, such as foam rubber or springs. The support plate for the programmable reflector may be bolted or otherwise secured onto the panel o the enclosure which retains both the acoustic source and the reflector, or alternatively the plate may be the actual panel of the enclosure itself.

Referring to the drawings, FIG. 1 displays an enclosure 10 which houses both the reflector 12 and the acoustic source 14 which in this instance consists of a diaphragm speaker 16 and a diaphragm tweeter 18 arranged in centered, overlying relation to the diaphragm speaker 16.

The reflector 12 is comprised of a flat back wall 30, a leading edge 32, a reflecting surface 34, and a trailing edge 36. Sound waves propagated by the diaphragm speaker 16 and/or the diaphragm tweeter 18 move toward the reflector 12, strike the reflective surface 34 and disperse into the listening room.

Figure 2:
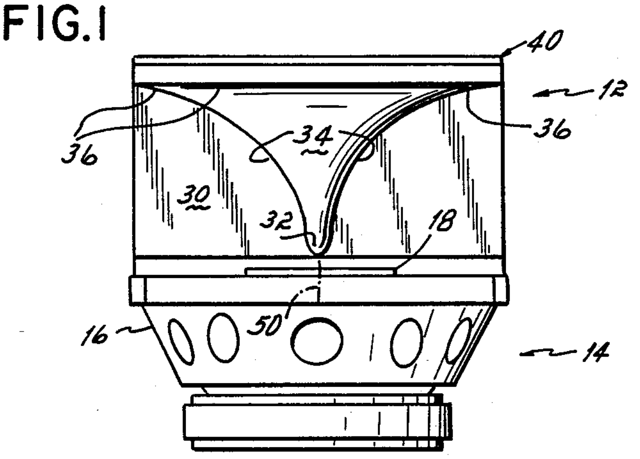
FIG. 2 is a front elevational view of the reflector with the loudspeaker acoustic source positioned below as seen on line 2—2 of FIG. 1.

The reflective surface 34 is depicted in both FIGS. 1 and 2 as a curved, concave surface. This design tends to improve the dispersion of the audio waves into the listening room. However, the reflective surface may be straight as in a "V"-shaped configuration, in a less preferred embodiment.

It is a feature of the invention that audio waves reflect from the reflective surface 34 with a minimum of phase cancellation attributable to the reflective surface.

The reflective surface 34 is formed preferably from molded plastic, resulting in a highly reflective surface with minimum surface aberration. The surface is formed from molded plastic by vacuum forming, injection molding or blow molding. The plastic is any which produces a hard, reflective, stable surface, such as acrylonitrile-butadiene-styrene terpolymer (ABS), polyvinyl chloride (PVC), or Fiberglas® from Owens-Corning Fiberglas Corp. More preferably, the leading edge 32, reflective surface 34, and trailing edge 36 are produced from a single piece of molded plastic to minimize stray reflections due to seams or joints. Alternatively, other materials may be employed in producing the leading edge 32, reflective surface 34, and trailing edge 36. Materials such as wood, metal, ceramics and glass, which may be formed and polished to produce a reflective surface having minimal aberration, may also be employed.

Figure 3:
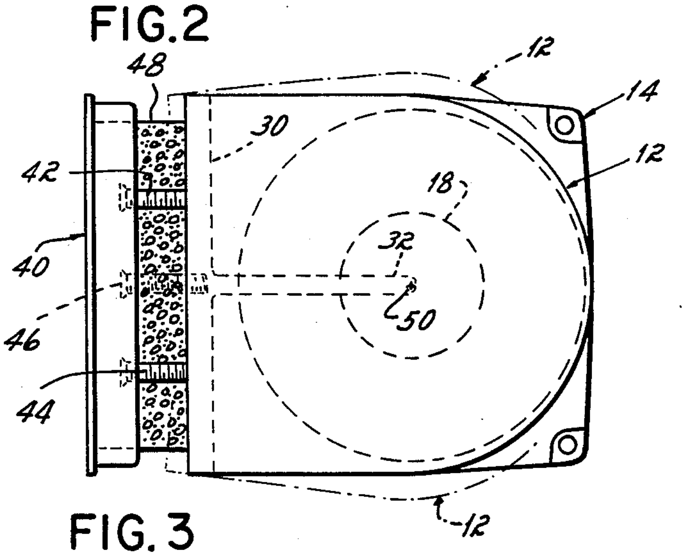
FIG. 3 is a top plan view of the programmable reflector as seen on line 3—3 of FIG. 1, demonstrating adjustment capability.

The programmability feature of the invention is demonstrated in FIG. 3. The reflector 12 is connected to the support plate 40 by means of adjustment screws 42, 44 and 46. Three screws are used in the preferred embodiment to adjust the reflector, but additional or fewer screws may be employed with good effect. A tensioning device 48 is located between reflector 12 and support plate 40 to retain tension on the reflector to keep it at its programmed distance from the support plate. It is preferred that the tensioning device 48 be formed from a material such as foam rubber or springs which are capable of retaining their shape over time. The tensioning device is preferably attached to the reflector 12 and support plate 40, such as by gluing. The tensioning device maintains tension on the adjustment screws 42, 44 and 46, and aids in supporting the reflector 12 in position over the acoustic source 14. The tensioning device 48 preferably is a continuous length of material or a single spring, but may alternatively be comprised of discrete sections or multiple springs.

Figure 4:
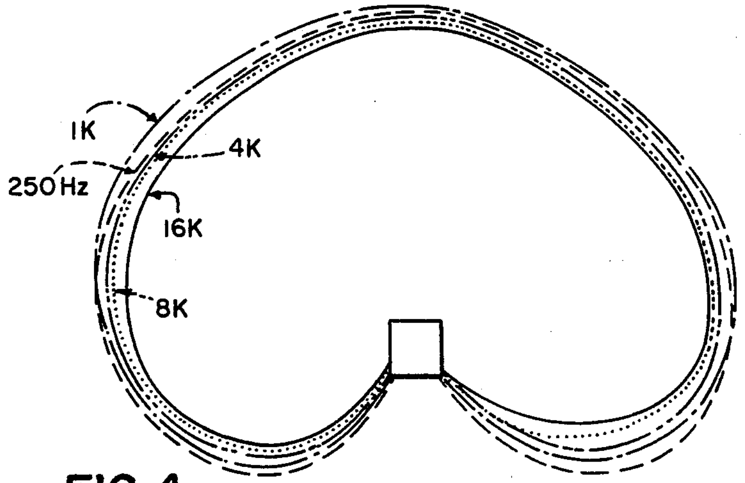
FIGS. 4–6 are graphic representations dispersal patterns for individual frequency audio waves for specific adjusted reflector positions.

In the preferred embodiment, reflector 12 is connected to support plate 40 by three adjustment screws 42, 44 and 46. As shown in FIG. 3, screws 42 and 44 are located above tensioning device 48 and are disposed to the left and right respectively of the leading edge 32. A single adjustment screw 46 is located below the tensioning device 48 and is located in approximately the same line as leading edge 32. In practice, screws 42 and 44 are adjusted first to achieve the desired angle of the reflector 12, and then screw 46 is adjusted to attain the desired vertical orientation of the reflector 12. The screw ports (not shown) in the support plate 40 are oversized to permit lateral movement by the screws 42, 44 or 46 during adjustment.

Where the reflector 12 is adjusted such that leading edge 32 terminates at a point approximate directly over the center point, or axis 50, of the acoustic source 14, the dispersal pattern for a range of frequencies from 250 Hz to 16,000 Hz created by that reflector position is shown in FIG. 4. The graphic representations were obtained by propagating specific frequencies at a volume level of 0 dB and determining the point where the output dropped below 0 dB using a spectrum analyzer at various points the listening room. The experiments which produced the representations in FIGS. 4, 5 and 6 were conducted using a Pioneer Corp. 5¼" coaxial round cone speaker having a centered, polycarbonate diaphragm tweeter. The reflector had a vertical height of about 2⅝", a length from back wall to trailing edge front of about 4½", and a width of back wall of 5".

Figure 5:
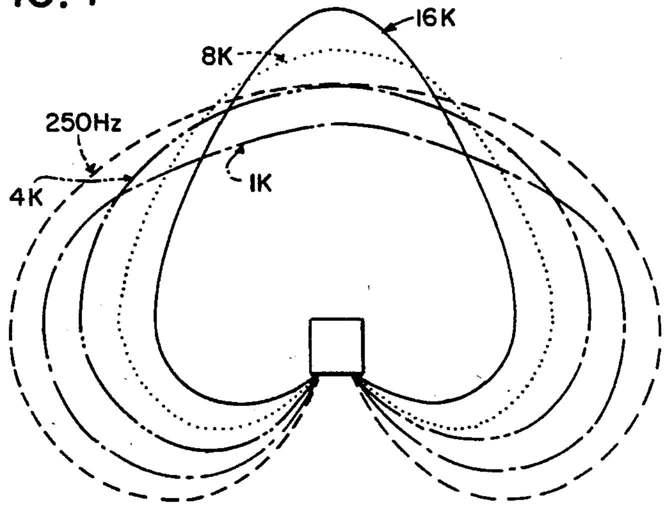
Figure 6:
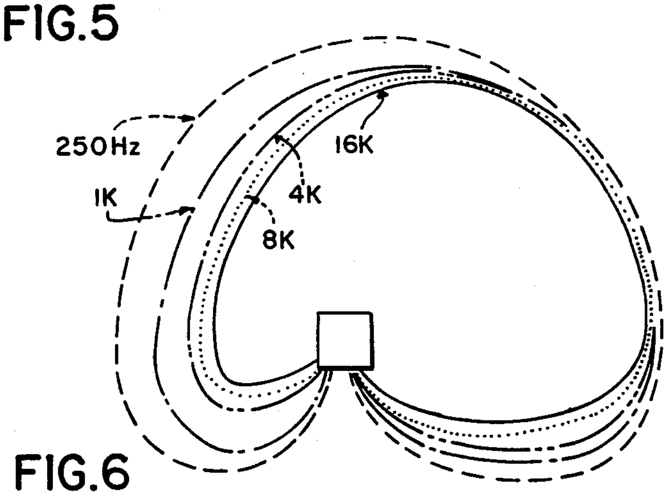

By adjusting screws 42, 44 and 46 equally so that reflector 12 is brought into a closer relation to support plate 40, the dispersal pattern as depicted in FIG. 5 is produced. With the reflector in this position, the leading edge 32 terminates at a point short of the axis 50 of the acoustic source 14. In this position more of the audio waves are directed by the reflector 12 forward into the listening room rather than to the sides.

Where adjustment screw 42 is tightened more than adjustment screw 44, that portion of reflector 12 in proximity to adjustment screw 42 comes into closer relation to support plate 40 than the remainder of the reflector 12. In this position, the leading edge 32 is disposed adjacent to but not overlying the axis 50 in a position approximately intersecting the axis 50. More audio waves are directed into the listening room to the side opposite adjustment screw 42. The graphic representation of the dispersal pattern for this reflector position is depicted in FIG. 6.

Because of the large range of adjustment capability, the reflector 12 may be positioned in such a manner as to optimize dispersal pattern for a particular listening area.

The preferred embodiment depicts a reflector 12 having a leading edge 32 which terminates at a point near the axis of the acoustic source 14. The area defined by the trailing edge 36 is slightly larger than that of the acoustic source 14. It is contemplated that reflectors of larger area may be used in conjunction with the acoustic source 14. This would encompass combinations of reflector and acoustic source wherein the leading edge would traverse the entire diameter of the acoustic source, or where the leading edge would terminate at a point short of overlying the acoustic source diameter.

Thus it is apparent that there has been provided, in accordance with the invention, a reflector in combination with a loudspeaker and capable of being programmed that fully satisfies the objects, aims and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A reflector for distributing audio waves in a substantially 180 degree dispersal pattern from a diaphragm speaker propagating the audio waves along a substantially single axis into a listening area comprising:

a flat back wall substantially parallel to and laterally spaced from said axis;

a reflecting surface from which said audio waves reflect directly into said listening area connected to said back wall, said reflecting surface having a leading edge connected to said back wall near said speaker, said leading edge approximately intersecting said axis; and a trailing edge connected to said back wall and said reflecting surface, said trailing edge encompassing an area greater than an area of said speaker.

2. The reflector of claim 1 wherein said leading edge is approximately perpendicular to said back wall.

3. The reflector of claim 1 wherein said reflecting surface extends from said leading edge at an angle of approximately 45 degrees.

4. The reflector of claim 1 having a concave reflecting surface.

5. The reflector of claim 1 wherein at least a portion of said reflecting surface is concave.

6. The reflector of claim 1 having a reflecting surface approximately a shape of a parabola.

7. The reflector of claim 1 wherein said audio waves are propagated along said axis in a generally vertical direction.

8. The reflector of claim 1 wherein said leading edge, said reflecting surface and said trailing edge are integrally formed from a single material.

9. The reflector of claim 8 wherein said material is molded plastic.

10. The reflector of claim 1 distributing audio waves from a plurality of diaphragm speakers arranged in a centered, overlying relation.

11. The reflector of claim 10 wherein at least one said diaphragm speaker is a cone speaker.

12. A loudspeaker system for distributing audio waves into a listening area in a substantially 180 degree dispersal pattern comprising:

an acoustic source comprised of at least one diaphragm speaker capable of propagating audio waves along a substantially single axis;

a reflector, comprised of a flat back wall substantially parallel to and laterally spaced from said axis, a reflecting surface from which said audio waves reflect directly into said listening area connected to said back wall, said reflective surface having a leading edge connected to said back wall near said acoustic source, said leading edge approximately intersecting said axis, and a trailing edge connected to said back wall and said reflecting surface, said trailing edge encompassing an area greater than an area of said acoustic source; and means to acoustically couple said acoustic source to said reflector.

13. The loudspeaker system of claim 12 wherein said leading edge of said reflector is approximately perpendicular to said back wall.

14. The loudspeaker system of claim 12 wherein said reflecting surface of said reflector extends from said leading edge at an angle of approximately 45 degrees.

15. The loudspeaker system of claim 12 wherein said reflector has a concave reflecting surface.

16. The loudspeaker system of claim 12 wherein at least a portion of said reflecting surface of said reflector is concave.

17. The loudspeaker system of claim 12 wherein said reflecting surface of said reflector approximates a shape of a parabola.

18. The loudspeaker system of claim 12 wherein said leading edge, said reflecting surface and said trailing edge of said reflector are integrally formed from a single material.

19. The loudspeaker system of claim 18 wherein said material is molded plastic.

20. The loudspeaker system of claim 12 wherein said means to acoustically couple said acoustic source to said reflector is an integral enclosure.

21. The loudspeaker system of claim 12 wherein said acoustic source is comprised of at least one cone speaker.

22. The loudspeaker system of claim 12 wherein said acoustic source is comprised of at least one polycarbonate diaphragm tweeter.

23. A reflector for distributing audio waves in a substantially 180 degree dispersal pattern from a diaphragm speaker propagating the audio waves along a substantially single axis wherein the reflector is programmable to adjust a direction of the dispersal pattern comprising:

a flat back wall substantially parallel to and laterally spaced from said path;

a reflecting surface connected to said back wall, said reflecting surface having a leading edge connected to said back wall near said speaker, said leading edge approximately intersecting said axis; and a trailing edge connected to said back wall and said reflecting surface, said trailing edge encompassing an area greater than an area of said speaker;

a support plate positioned parallel to back wall and opposite said reflecting surface;

a tensioning device disposed between said plate and said back wall; and adjusting means connecting said back wall and said support plate for rendering said back wall non-parallel to said support plate.

24. The reflector of claim 23 wherein said leading edge is approximately perpendicular to said back wall.

25. The reflector of claim 23 wherein said adjusting means is a plurality of screws.

26. The reflector of claim 23 wherein said tensioning device is foam rubber.

27. The reflector of claim 23 wherein said support plate is a panel of an enclosure retaining said acoustic source and said reflector.

28. The reflector of claim 23 distributing audio waves from a plurality of diaphragm speakers arranged in a centered, overlying relation.

* * * * *

UNITED STATES PATENT AND TRADEMARK OFFICE
CERTIFICATE OF CORRECTION

PATENT NO. : 4,907,671

DATED : March 13, 1990

INVENTOR(S) : Robert J. Wiley

It is certified that error appears in the above-identified patent and that said Letters Patent is hereby corrected as shown below:

Col. 4, line 6, "o" should be --of--.

Col. 5, line 16, "approximate" should be --approximately--.

Col. 5, line 24, after "points" insert --in--.

Signed and Sealed this

Twenty-ninth Day of September, 1992

*Attest:*

DOUGLAS B. COMER

*Attesting Officer* *Acting Commissioner of Patents and Trademarks*